United States Patent [19]

Rand et al.

[11] Patent Number: 4,784,716
[45] Date of Patent: Nov. 15, 1988

[54] HYBRID SINGLE CRYSTAL OPTIC FIBERS BY EMBEDDING

[75] Inventors: Stephen C. Rand, Agoura; Ricardo C. Pastor, Manhattan Beach, both of Calif.

[73] Assignee: The United States of America as represented by the Secretary of the Air Force, Washington, D.C.

[21] Appl. No.: 795,572

[22] Filed: Nov. 6, 1985

[51] Int. Cl.$^4$ ............................................. C30B 27/00
[52] U.S. Cl. ................................... 156/621; 156/624;
156/DIG. 112; 350/96.10; 350/96.20;
350/96.29; 350/96.30; 350/96.31; 350/320
[58] Field of Search ............ 156/621, 624, DIG. 112;
350/96.10, 96.20, 96.29, 96.30, 96.31, 320

[56] References Cited

U.S. PATENT DOCUMENTS

| | | | |
|---|---|---|---|
| 2,979,424 | 4/1961 | Whitehurst et al. | 350/96.1 |
| 3,811,912 | 5/1974 | Ramaswamy | 350/96.34 |
| 4,265,689 | 5/1981 | Jeffrey | 156/73.2 |
| 4,444,458 | 4/1984 | Stowe et al. | 350/96.15 |
| 4,444,460 | 4/1984 | Stowe | 350/96.2 |
| 4,521,073 | 6/1985 | Murakami et al. | 350/96.34 |
| 4,647,330 | 3/1987 | Rand | 156/624 |

FOREIGN PATENT DOCUMENTS

| | | | |
|---|---|---|---|
| 202360 | 4/1979 | Fed. Rep. of Germany | 156/624 |
| 54-127336 | 10/1979 | Japan | 350/96.3 |

OTHER PUBLICATIONS

Stolen, Roger H. et al., "Parametric Amplification and Frequency Conversion in Optical Fibers," IEEE Journal of Quantum Electronics, vol. QE-18, No. 7, Jul. 1982, pp. 1062–1072.

Koester, Charles J., "9A 4-Laser Action by Enhanced Total Internal Reflection," IEEE Journal of Quantum Electronics, vol. QE-2, No. 9, Sep. 1966, pp. 580–584.

Koester, Charles J. et al., "Amplification in a Fiber Laser," Applied Optics, vol. 3, No. 10, Oct. 1964, pp. 1182–1186.

Chraplyvy, A. R. et al., "Infrared Generation by Means of Multiple-Order Stimulated Raman Scattering in $CCl_4$- and $CBrCl_3$-Filled Hollow Silica Fibers," Optic Letters, vol. 6, No. 12, Dec. 1981, pp. 632–633.

Hewig, G. H. et al., "Frequency Doubling in a $LiNbO_3$ Thin Film Deposited on Sapphire," J. Appl. Phys., 54, (1), Jan. 1983, pp. 57–61.

Primary Examiner—John Doll
Assistant Examiner—Robert M. Kunemund
Attorney, Agent, or Firm—Stanton E. Collier; Donald J. Singer

[57] ABSTRACT

A process of fabricating a hybrid single crystal fiber having nonlinear optical properties such as frequency doubling. Said process includes applying a force to a fiber core resting upon a bulk nonlinear crystal such as $LiIO_3$ in a saturated solution of $LiIO_3$ in water. After the core is embedded a sufficient distance into the crystal the force is removed.

6 Claims, 1 Drawing Sheet

HYBRID SINGLE CRYSTAL OPTIC FIBERS BY EMBEDDING

STATEMENT OF GOVERNMENT INTEREST

The invention described herein may be manufactured and used by or for the Government for governmental purposes without the payment of any royalty thereon.

BACKGROUND OF THE INVENTION

This invention relates generally to glass fiber optics, and particularly, relates to a process of fabricating fibers useful in nonlinear optics applications.

Previous nonlinear optical fibers have relied on 4-wave mixing in glass fibers, doping of glass fiber claddings, or cores, or liquid core fibers. Phase-matched 3-wave mixing (frequency doubling, summation or difference generation and parametric amplification) has never been achieved in glass fibers. Although planar waveguides have been used for frequency doubling, their efficiency is limited by short interaction length and high losses coupling into and out of such structures. Also, the use of planar guides in certain fiber optic systems is restricted by differences in the guide shapes themselves corresponding to differences in their mode structures.

For example, in conventional fiber optics, light is guided by total internal reflection in a filament of glass having a glass cladding of lower index fused on the light-carrying core to provide a good interface at which reflection occurs. When a doped cladding is applied to a passive core, and the cladding has a lower index, a small portion of the light penetrates into the lower index cladding in the form of an evanescent wave. Depending on the type of cladding, oscillations and amplification of the input light signal may occur.

Frequency doubling has been obtained in planar optical waveguides using nonlinear interactions therein. For example, a thin film of $LiNbO_3$ was rf-sputtered onto a sapphire substrate. Tunable laser radiation was coupled into this guide and phase-matched and frequency up-conversion was obtained with an efficiency of about $10^{-3}$. The problem associated with this method was that there is a short interaction length. The use of planar waveguides in fiber optics systems is unlikely because of the short interaction distance and the problems associated therewith.

The present invention is directed toward providing a process of fabricating hybrid single crystal optical fibers for frequency conversion and amplification in which the above undesirable characteristics are minimized.

SUMMARY OF THE INVENTION

The instant invention set forth a process of fabricating hybrid single crystal optical fibers having nonlinear optical properties therein and thereby overcome the problems set forth hereinabove. This process is distinct from the well known process of regelation.

In the process of this invention, a fiber core is placed in direct contact with a bulk nonlinear crystal having an essentially flat surface thereon. The fiber core and bulk nonlinear crystal are immersed in a saturated solution where the equilibrium solid phase has the same composition as the bulk nonlinear crystal. While therein, a weight is placed upon the fiber core for a period of time sufficient to cause the fiber core to become embedded therein and thus have good optical contact therewith. The weight may additionally consist of a second bulk crystal, identical in composition and crystallographic orientation to the first, placed upon the fiber core with a simple weight placed upon the whole. This provides a symmetric, homogeneous crystalline cladding for the hybrid fiber.

Because of evanescent wave coupling between modes guided by the fiber, whose index of refraction exceeds that of the bulk nonlinear crystal, nonlinear optical polarizations can be generated in the nonlinear optical crystal which radiates new frequencies back into the guided modes. The fiber thereby acquires controllable nonlinear optical properties which glass fibers do not possess.

One object of the present invention is a process to fabricate hybrid single crystal optical fibers.

Another object of the present invention is a process whereby a fiber core is covered over a substantial length and surface area by a bulk nonlinear crystal.

Another object of the present invention is a process of fabricating hybrid single crystal optical fibers for frequency conversion such as doubling.

Another object of the present invention is a process of fabricating hybrid single crystal optical fibers for light amplification by parametric mixing.

These and many other objects and advantages of the present invention will be readily apparent to one skilled in the pertinent art from the following detailed description of a preferred embodiment of the invention and the related drawings.

DETAILED DESCRIPTION OF THE PREFERRED EMBODIMENT

Figure 1:
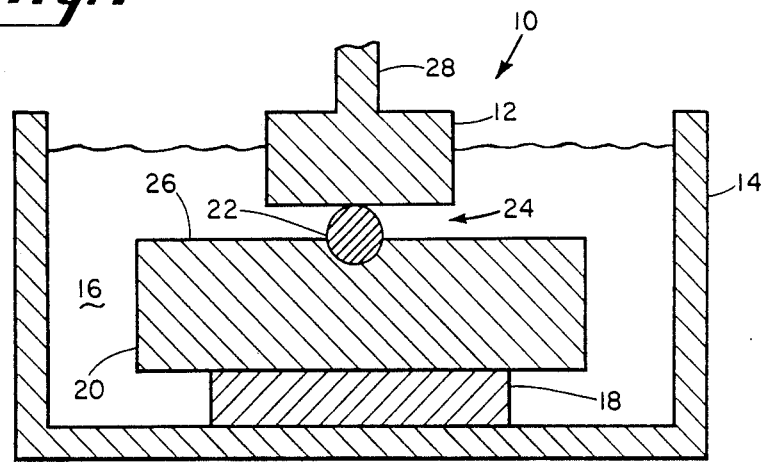
FIG. 1 is a cross-section of the apparatus used to carry out the process of the present invention.
Figure 2:
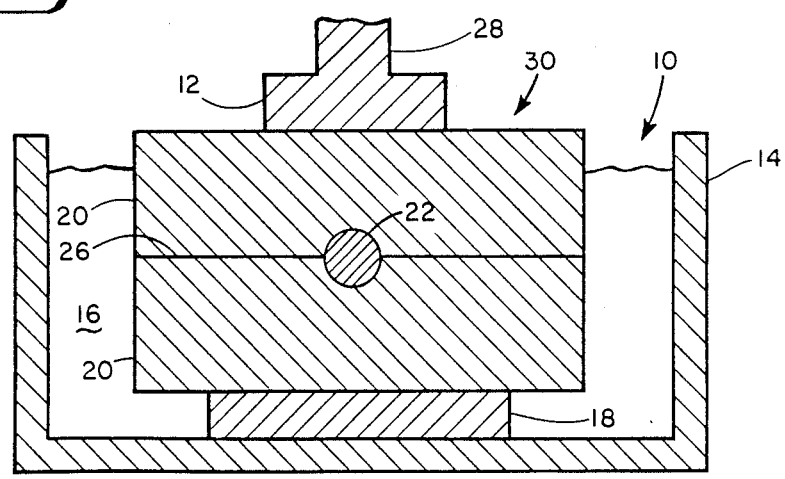
FIG. 2 is a cross-section of the apparatus of FIG. 1 with the addition of a second bulk crystal.

Referring to FIG. 1, an apparatus 10 for fabricating a hybrid single crystal fiber 24 is shown in cross section. Hybrid single crystal fiber 24 comprises an optical fiber core 22 being glass, for example, and a bulk nonlinear crystal 20 intimately joined by embedding together in a manner to be described. FIG. 2 illustrates the use of two bulk nonlinear crystals 20 about fiber core 22 to produce a hybrid single crystal fiber 30 totally embedded therein.

In FIG. 1, bulk nonlinear crystal 20 rests in a container 14 on a support 18. Fiber core 22 is initially placed on a flat top surface 26 of bulk nonlinear crystal 20. A weight 12 is placed directly upon fiber core 22 and bears down thereupon until fiber core 22 has embedded itself into bulk nonlinear crystal 20 to a point where fiber core 22 is approximately buried to one half its diameter as shown in FIG. 1. Weight 12 has a supporting member 28 which provides stability to weight 12 while bearing upon fiber core 22. It is clearly seen that the biasing force provided by weight 12 can also be provided by a controlled biasing means, not shown. The amount of biasing force can thus be adjusted to vary the rate of embedding. The rate of embedding also depends on such factors as the temperature of solution 16, its composition, etc.

As illustrated in FIG. 2, a second bulk nonlinear crystal 20 may be placed on top of fiber core 22 of FIG. 1. The upper bulk nonlinear crystal 20 may be identical in composition and crystallographic orientation to lower bulk nonlinear crystal 20. This provides a symmetric, homogeneous crystalline cladding for a hybrid single crystal fiber 30. Clearly, upper bulk nonlinear crystal 20 provides additional weight to weight 12. Thus fiber core 22 becomes embedded totally in lower and upper bulk nonlinear crystals 20.

The size of bulk nonlinear crystal 20 obviously is selected to minimize waste. Further, multiple fiber cores 22 can be placed upon bulk nonlinear crystal 20 in a parallel manner or otherwise, for the simple purpose of multiplicity or for coupling different fibers or for coupling a given fiber to itself at several different spatial locations.

Solution 16 is a saturated solution whose equilibrium solid phase matches the composition of bulk nonlinear crystal 20 including water.

Hybrid single crystal fiber 24 is fabricated by applying the gravitional force of $4.5 \times 10^5$ dynes to an unclad 125 micron silica fiber 22 in contact with a $LiIO_3$ bulk nonlinear crystal 20 in a saturated solution of $LiIO_3$ in water. This force was applied at room temperature of about 70° F. for a period of twenty four hours and resulted in a 1 cm length of fiber 22 being embedded to a depth of roughly one-half its diameter and firmly incorporated in crystal 20. Microscopic examination of hybrid single crystal fiber 24 indicated good optical contact.

The biasing force may be applied indirectly wherein the fiber core 22 is held taut and is brought to bear on crystal surface 26 by a fiber core holding device, not shown.

The above process yields oriented fibers in virtually any ionic solid grown from solution. Fiber/crystal combinations other than silica/$LiIO_3$ which have also been used to make hybrids include Shott PK3/ADP and Shott BK1/KDP. Because of evanescent wave coupling between modes guided by fibers 24, whose index of refraction exceeds that of crystal 20, nonlinear optical polarization can be generated in the nonlinear optical crystal which radiates new frequencies back into the guided mode. The fiber 24 thereby acquires controllable nonlinear optical properties.

Because of the above nonlinear optical properties, hybrid single crystal fibers 24 or 30 can be used in frequency conversion and amplification. Weak, coherent light sources can be doubled in frequency, summed, or differenced, and parametric process can convert guided light into new frequencies and amplify. These fibers 24 are thus useful in fiber-optic systems for communications, fiber gyroscopes, fiber taps, and sensors.

Clearly, many modifications and variations of the present invention are possible in light of the above teachings and it is therefore understood, that within the inventive scope of the inventive concept, the invention may be practiced otherwise than specifically claimed.

What is claimed is:

1. A process of fabricating hybrid single crystal fibers, said process comprising the steps of:
   placing a bulk nonlinear crystal in a container for holding a solution, said bulk nonlinear crystal having a substantially flat upper surface;
   selectively placing at least one fiber core on said surface of said bulk nonlinear crystal;
   holding said fiber core upon said upper surface;
   placing a controlled force biasing means for bearing upon said fiber on top of said fiber core;
   filling said container with a saturated solution whose equilibrium solid phase matches the composition of said crystal, said solution covering said fiber core;
   applying said biasing means to said fiber core in a controlled manner; and
   releasing said biasing means after said fiber core is embedded a fixed distance into said bulk nonlinear crystal.

2. A process as defined in claim 1 wherein said bulk nonlinear crystal is an ionic solid capable of solution growth.

3. A process as defined in claim 2 wherein said ionic solid is selected from the group consisting of $LiIO_3$, ADP and KDP.

4. A process of fabricating hybrid single crystal fibers, said process comprising the steps of:
   placing a lower bulk nonlinear crystal in a container for holding a solution, said lower bulk nonlinear crystal having a substantially flat upper surface;
   selectively placing at least one fiber core on said upper surface of said lower bulk nonlinear crystal;
   placing selectively an upper bulk nonlinear crystal having a substantially flat lower surface on top of said at least one fiber core on said upper surface of said lower bulk nonlinear crystal;
   placing a controlled force biasing means for bearing upon said upper bulk nonlinear crystal;
   filling said container with a saturated solution whose equilibrium solid phase matches the composition of said crystal, said solution covering said fiber core;
   applying said biasing means to said fiber core in a controlled manner; and
   releasing said biasing means after said fiber core is embedded into said bulk nonlinear crystals.

5. A process as defined in claim 4 wherein said bulk nonlinear crystal is an ionic solid capable of solution growth.

6. A process as defined in claim 5 wherein said ionic solid is selected from the group consisting of $LiIO_3$, ADP and KDP.

* * * * *